United States Patent [19]

Cox

[11] 4,184,726

[45] Jan. 22, 1980

[54] REVERSIBLE MOUNTING BRACKET

[75] Inventor: Roger F. Cox, Northbrook, Ill.

[73] Assignee: Norlin Industries, Inc., Lincolnwood, Ill.

[21] Appl. No.: 898,664

[22] Filed: Apr. 21, 1978

[51] Int. Cl.² ............................................. A47B 95/02
[52] U.S. Cl. ............................ 312/320; 312/257 SK; 361/391; 248/271
[58] Field of Search ............ 312/320, 257 SK, 257 A; 248/271; 361/391, 376

[56] References Cited

U.S. PATENT DOCUMENTS

| | | | |
|---|---|---|---|
| 2,926,056 | 2/1960 | Newcomer, Jr. et al. | 312/320 |
| 2,950,947 | 8/1960 | Ronzio | 312/320 |
| 3,120,412 | 2/1964 | Caldwell | 312/320 |
| 3,413,050 | 11/1968 | Sommers et al. | 312/320 |
| 3,813,004 | 5/1974 | Andreaggi | 248/271 |
| 4,089,464 | 5/1978 | Teti, Jr. et al. | 248/271 |

Primary Examiner—Victor N. Sakran
Attorney, Agent, or Firm—Ronald J. Kransdorf; Jack Kail

[57] ABSTRACT

A reversible bracket assembly for use with an electronic apparatus bearing housing or the like includes an elongate plate having opposed sides each suitably fastenable to the side panels of the housing. A mounting flange extends transversely of and integrally from one end of the plate and a handle member extends integrally from the other end of the plate. The plate is fastenable to the housing with one of its sides in abutment with the housing side panels for facilitating portable transportation and use of the housing by means of the handle members and with its other side in abutment with the housing side panels for facilitating mounting of the housing within a standard equipment rack through the agency of the mounting flange.

6 Claims, 5 Drawing Figures

REVERSIBLE MOUNTING BRACKET

BACKGROUND OF THE INVENTION

The present invention relates to mounting brackets and, more particularly, to mounting brackets of the type suitable for use in association with rack mountable electronic apparatus bearing housings or the like.

Electronic equipment of various varieties is frequently packaged in a housing suitable for being received or mounted within with a so-called standard 19-inch equipment rack. These racks typically comprise a box-like structure in which a plurality of electronic apparatus bearing housings may be mounted normally stacked one over the other. Depending upon particular needs, the rack may be conveniently customized by mounting equipment having desired functional capabilities and by dismounting or removing any equipment not required for the particular purpose. Mounting and dismounting of the equipment housings is conventionally achieved by the use of rack mounting kits normally consisting of a number of loose parts such as adapter plates, nuts, bolts and associated hardware by means of which the housings are removably fastenable within the equipment racks.

In one known application, a number of electronic signal processors of the type used in the music industry, eg. parametric and graphic equalizers, are commonly mounted within a standard equipment rack for achieving certain performance capabilities at a single location. The individual signal processors are contained within separate housings and mounted within the rack by means of the previously described rack mounting kits. However, it is not uncommon for there to exist a need to use one or more individual items of equipment at a location remote from the equipment racks. For instance, the musical signal processors referred to above must also be suitable for use "on the road" where the equipment is transported from site to site. In this case, the housings bearing the signal processors are removed from the rack for conveyance and use as required and, of course, the various parts comprising the rack mounting kits must be suitably stored for reusage. Unfortunately, in the process, many of the parts of the kits are frequently lost resulting in a rather significant nuisance factor. In addition, the equipment housing themselves, unless specially designed, are generally not particularly suited for convenient handling wherein their portable use becomes a rather cumbersome task.

Although the prior art discloses numerous mounting brackets useful in diverse applications, none of these brackets are believed to overcome the problems noted above. Exemplary of prior art mounting brackets are the structures disclosed in U.S. Pat. No. 3,704,395 to Hamer et al, U.S. Pat. No. 3,403,641 to Baker, U.S. Pat. No. 3,730,472 to Dale, U.S. Pat. No. 2,912,119 to Robinson and U.S. Pat. No. 930,734 to Dahl.

SUMMARY OF THE INVENTION

In view of the foregoing, it is a basic object of the present invention to provide a new and improved mounting bracket for use with a rack mountable electronic equipment bearing housing.

It is a further object of the invention to provide a mounting bracket particularly useful in association with rack mountable equipment housings for facilitating both portable transportation and use of the housings as well as mounting of the housings within standard equipment racks.

In accordance with these and other useful objects, the bracket assembly of the present invention is reversibly fastenable to the side panels of an electronic apparatus bearing housing or the like for facilitating, in one orientation, the portable transportation and use of the housing and, in a second orientation, the mounting of the housing within a standard equipment rack.

More specifically, the reversible mounting bracket of the present invention comprises an elongate plate having a pair of opposed sides and a peripheral configuration substantially conforming with the peripheral configuration of the side panels of an electronic apparatus bearing housing or the like. Means are provided for fastening the elongate plate with either of its sides in abutment with the housing side panels. A mounting flange extends transversely of and integrally from one end of the elongate plate and includes means for enabling fastening of the flange within a standard equipment rack. Lastly, a handle member extends integrally from the other end of the elongate plate.

On fastening the bracket to the equipment housing with one side in abutment with the housing side panels, the mounting flange overlies a portion of the housing rear panel while the handle member projects beyond the housing front panel. The projecting handle members facilitate portable transportation and handling of the equipment housing when the bracket is secured in this fashion. On fastening the bracket to the equipment housing with its other side in abutment with the housing side panels, the handle members project beyond the housing rear panel whereas the mounting flange is disposed in juxtaposition with the housing front panel. This fastening orientation facilitates mounting of the housing within a standard equipment rack by suitably securing the mounting flanges thereto.

DESCRIPTION OF PREFERRED EMBODIMENT

Figure 2:
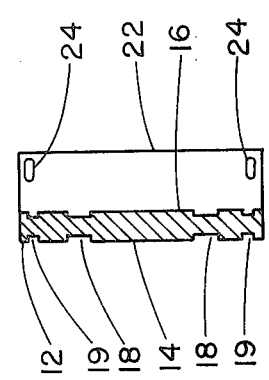
FIG. 2 is a cross sectional view taking along line 2—2 of FIG. 1.
Figure 1:
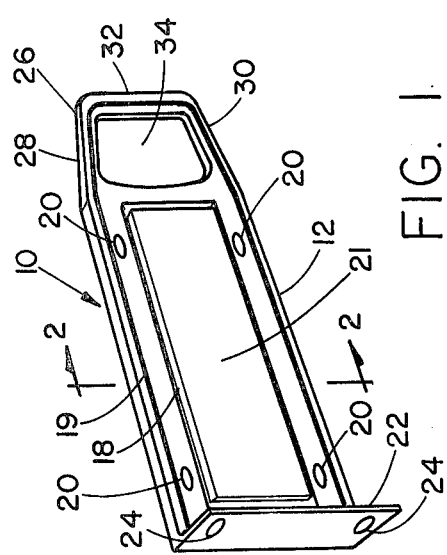
FIG. 1 is a perpective view showing the reversible mounting bracket of the present invention.

Referring now to the drawings and, in particular, to FIGS. 1 and 2, the reversible mounting bracket of the invention, identified generally by reference numeral 10, comprises a generally rectangular elongate plate 12 having a pair of opposed sides 14 and 16. A channel 18 of U-shaped cross-section is formed in each of the sides 14 and 16 and extends in substantial conformity with and spaced inwardly of the periphery of plate 12. Channel 18 rectangularly circumscribes an integrally formed structure 21 suitable for receiving or carrying a name tag or the like. A plurality of apetures 20, appropriately configured for receiving fastening bolts or the like, are formed in plate 12 intermediate its periphery and channel 18.

A mounting flange 22 extends transversely of and integrally from one end of plate 12 and includes a plurality of apetures 24 suitably configured for receiving a series of fastening bolts or the like. Extending integrally from the other end of plate 12 is a handle member 26 consisting of a pair of legs 28 and 30 and a base 32. The legs 28 and 30 and base 32 of handle member 26 define in association with plate 12 an aperture 34 appropriately configured for receiving an individual's hand. A second channel 19, also of U-shaped cross-section, is formed in each of the sides 14 and 16 of elongate plate 12 adjacent its periphery and extends along the legs 28 and 30 and base 32 of handle member 26. Bracket 10 thus comprises a unitary structure consisting of elongate plate 12, mounting flange 22 extending transversely from one end of the plate and handle member 26 extending in coplaner relationship from the other end of the plate. While the structure comprising bracket 10 is preferably formed in a mold through a suitable casting operation, it is also contemplated that the bracket may be formed by suitably deforming a piece of sheet metal or the like in accordance with any of a number of well known metal deforming techniques.

Figure 3:
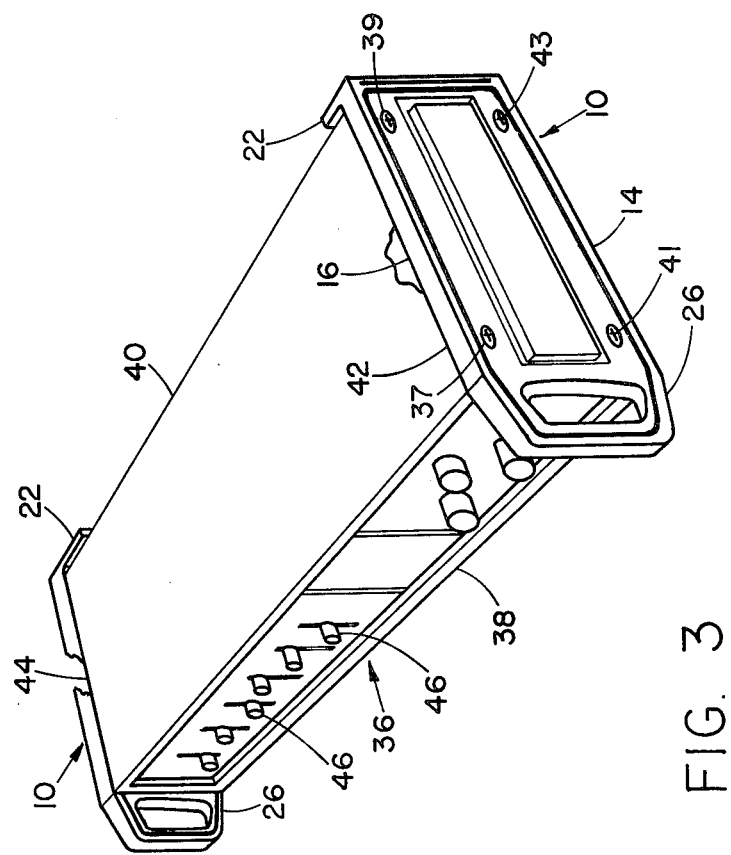
FIG. 3 illustrates a pair of reversible brackets constructed according to the present invention secured to the side panels of an electronic apparatus bearing housing in a first orientation.

FIG. 3 illustrates the manner in which a pair of brackets 10 are fastenable to an electronic apparatus bearing housing 36 for facilitating portable transportation and use thereof. It will be appreciated that housing 36 may contain a variety of electronic equipment, eg. various types of musicl signal processors, and includes a front panel 38, a spaced rear panel 40 and a pair of transversely extending side panels 42 and 44. Front panel 38 of housing 36 typically includes a plurality of control members 46 which may comprise, for example, operating knobs, slide levers and the like. Brackets 10 are secured in association with housing 36 by means of suitable fasteners 37, 39, 41 and 43 extending through apetures 20 and corresponding apetures in the housing side panels such that inner side 16 of the brackets are in abutment with the housing side panels 42 and 44. Outer sides 14 of brackets 10 are thus disposed facing away from housing 36. In this mounting orientation, bracket flanges 22 extend behind and overlie portions of rear panel 40 while handle members 26 project beyond housing front panel 38. It will be noted that the peripheral configuration of elongate plate 12 of bracket 10 conforms substantially to the peripheral configuration of the side panels 42 and 44 of housing 36. Therefore, on mounting brackets 10 in association with housing 36, as illustrated in FIG. 3, mounting flanges 22 are disposed in substantially flush engagement with housing rear panel 40 while handle members 26 extend forwardly beyond housing control panel 36. Moreover, handle members 26 are configured to extend forwardly of control panel 36 to an extent greater than control members 46. In this manner, handle members 26 serve to provide a degree of protection from inadvertent damage to any of the control members. Moreover, the forwardly projecting handle members 26 provide a facility for portably transporting and using housing 10 and, in addition, elongate plates 12 provide protection for housing side panels 42 and 44 while flanges 22 protect housing rear panel 40 during such portable use.

Figure 4:
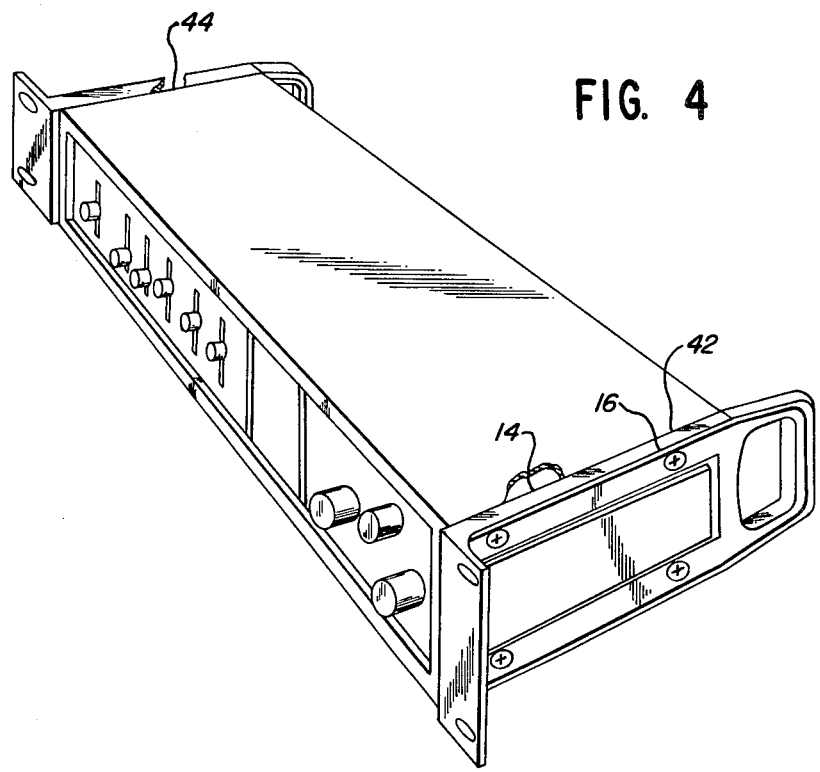
FIG. 4 illustrates a pair of reversible brackets constructed according to the present invention secured in association with the side panels of an electronic apparatus bearing housing in a second orientation.

FIG. 4 illustrates the manner in which brackets 10 are secured in association with housing 36 for facilitating rack mounting of the housing. It will be noted that each bracket 10 is rotated 180 degrees with respect to its orientation in FIG. 3 such that sides 14 are in abutment with housing side panels 42 and 44. In this orientation, flanges 22 are disposed in juxtaposition with housing control panel 38 while handle members 26 extend rearwardly beyond housing rear panel 40. Thus, the housing 36 may be conveniently mounted with a rack space by passing suitable fastening means through apetures 24 in mounting flange 22 and corresponding apetures in an equipment rack.

Figure 5:
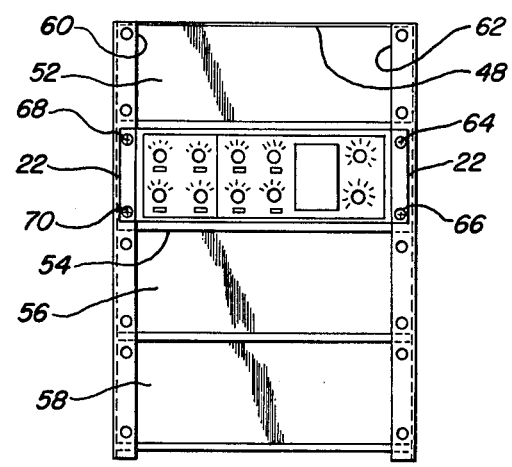
FIG. 5 shows the method of mounting an electronic apparatus bearing housing within a standard rack assembly utilizing the reversible brackets of the present invention.

FIG. 5 diagramatically illustrates a standard equipment rack 48 having a plurality of rack spaces 52, 54, 56 and 58 and a pair of opposed mounting flanges 60 and 62. Mounted within rack space 54 is a housing 36 having brackets 10 secured thereto in the manner illustrated in FIG. 4. It will be observed that mounting flanges 22 of brackets 10 overlie mounting flanges 60 and 62 of rack 48. Fastening means 64, 66, 68 and 70 are received through apetures 24 in mounting flange 22 and pass through corresponding apetures in flanges 60 and 62. Suitable nuts or the like (not shown) may be utilized in association with fastening means 64, 66, 68 and 70 to finally secure the housing within the rack space.

Should the need arise to remove a housing mounted within rack 48, the fastening means 64, 66, 68 and 70 may conveniently be removed and the housing slid from the rack space. Brackets 10 may be subsequently removed from the housing and resecured thereto in the orientation illustrated in FIG. 3. The housing-bracket combination is thereby conveniently converted for portable use.

What has been shown is a bracket assembly reversibly fastenable to the side panels of an electronic apparatus bearing housing or the like for facilitating, in one orientation, the portable transportation and use of the housing and, in a second orientation, the mounting of the housing within a standard equipment rack.

While a particular embodiment of the invention has been shown and described, it will be obvious to those skilled in the art that changes and modifications may be made without departing from the invention in its broader aspects, and , therefore, the aim in the appended claims is to cover all such changes and modifications as fall within the true spirit and scope of the invention.

I claim:

1. A reversible bracket for use with an electronic apparatus bearing housing or the like, said housing being suitable for mounting within a rack space and comprising a box-like structure having a front control panel, a spaced rear panel and a pair of transverse side panels, said bracket comprising:

an elongate plate having a peripheral configuration substantially coextensive with the peripheral configuration of said side panels and including means for enabling fastening of said plate to said side panels;

a mounting flange extending integrally from and transversely of one end of said plate and including means of enabling fastening of said flange within said rack space; and handle means extending integrally from the other end of said plate, whereby said plate is fastenable to one of said side panels in a first orientation with said flange overlying a portion of said rear panel and said handle means projecting beyond said front panel facilitating portable transportation and use of said housing and in second orientation with said flange disposed in juxtaposition with said front panel and said handle means projecting beyond said rear panel facilitating mounting of said housing within said rack space.

2. The reversible bracket according to claim 1 wherein said elongate plate includes first and second opposed sides and wherein said means for enabling fastening of said plate comprises a plurality of apetures disposed about the periphery of said plate enabling fastening of said plate to said side panels with said first side in abutment with said side panel and with said second side in abutment with said side panel.

3. The reversible bracket according to claim 1 wherein said front panel includes a plurality of control members extending therefrom and wherein, when said plate is fastened in said first orientation, said flange is in substantial abutment with said rear panel and said handle means projects beyond said control members providing protection therefor.

4. The reversible bracket according to claim 1 wherein said handle means comprises a generally U-shaped structure having a pair of legs and a base and defining in association with said other end of said elongate plate an apeture suitable for receiving an individual's hand.

5. The reversible bracket according to claim 4 wherein U-shaped structure and said elongate plate are defined by a common plane passing therethrough.

6. The reversible bracket according to claim 1 wherein said mounting flange includes at least two spaced apetures for receiving fastening bolts for enabling fastening of said flange within said rack space.

* * * * *